United States Patent
Troy et al.

(10) Patent No.: US 6,456,045 B1
(45) Date of Patent: Sep. 24, 2002

(54) INTEGRATED CONDUCTANCE AND LOAD TEST BASED ELECTRONIC BATTERY TESTER

(75) Inventors: Michael E. Troy, Lockport; Kevin I. Bertness, Batavia, both of IL (US)

(73) Assignee: Midtronics, Inc., Willowbrook, IL (US)

( * ) Notice: Subject to any disclaimer, the term of this patent is extended or adjusted under 35 U.S.C. 154(b) by 0 days.

(21) Appl. No.: 09/870,410

(22) Filed: May 30, 2001

Related U.S. Application Data

(63) Continuation-in-part of application No. 09/703,270, filed on Oct. 31, 2000, which is a continuation-in-part of application No. 09/293,020, filed on Apr. 16, 1999.
(60) Provisional application No. 60/208,264, filed on May 31, 2000, and provisional application No. 60/163,013, filed on Nov. 1, 1999.

(51) Int. Cl.$^7$ .................................................. H02J 7/04
(52) U.S. Cl. ....................................... 320/139; 324/426
(58) Field of Search .............................. 320/139, 137, 320/136, 134; 324/425, 426, 429, 430

(56) References Cited

U.S. PATENT DOCUMENTS

| | | | |
|---|---|---|---|
| 2,514,745 A | 7/1950 | Dalzell | 324/115 |
| 3,356,936 A | 12/1967 | Smith | 324/429 |
| 3,562,634 A | 2/1971 | Latner | 324/427 |

(List continued on next page.)

FOREIGN PATENT DOCUMENTS

| | | |
|---|---|---|
| DE | 29 26 716 B1 | 1/1981 |
| EP | 0 022 450 A1 | 1/1981 |
| EP | 0 637 754 A1 | 2/1995 |
| EP | 0 772 056 A1 | 5/1997 |
| FR | 2 749 397 | 12/1997 |
| GB | 2 088 159 A | 6/1982 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04131779 | 5/1992 |
| JP | 04372536 | 12/1992 |
| JP | 5216550 | 8/1993 |
| JP | 7-128414 | 5/1995 |
| WO | WO 93/22666 | 11/1993 |
| WO | WO 94/05069 | 3/1994 |
| WO | WO 98/58270 | 12/1998 |

OTHER PUBLICATIONS

"Alligator Clips with Wire Penetrators" J.S. Popper, Inc. product information, downloaded from http://www.jspopper.com, Mar. 22, 2002.

"#12: LM78S40 Simple Switcher DC to DC Converter", *ITM e–Catalog*, downloaded from http://www.pcbcafe.com, Feb. 9, 1998.

(List continued on next page.)

*Primary Examiner*—Edward H. Tso
*Assistant Examiner*—Lawrence Luk
(74) *Attorney, Agent, or Firm*—Westman, Champlin & Kelly

(57) ABSTRACT

An electronic battery tester for testing a storage battery includes first and second Kelvin connections configured to couple to the battery. A forcing function applies a time varying signal to the battery through the first and second Kelvin connections. Further, a resistive load is configured to couple across the first and second terminals of the battery and draw a relatively large current. The storage battery is tested as a function of a dynamic parameter measured through the first and second Kelvin connections and as a function of a response of the storage battery to the relatively large current drawn through the resistive load.

36 Claims, 2 Drawing Sheets

U.S. PATENT DOCUMENTS

| | | | |
|---|---|---|---|
| 3,593,099 A | 7/1971 | Scholl | 320/127 |
| 3,607,673 A | 9/1971 | Seyl | 204/404 |
| 3,676,770 A | 7/1972 | Sharaf et al. | 324/430 |
| 3,729,989 A | 5/1973 | Little | 324/162 |
| 3,753,094 A | 8/1973 | Furuishi et al. | 324/430 |
| 3,808,522 A | 4/1974 | Sharaf | 324/430 |
| 3,811,089 A | 5/1974 | Strezelewicz | 324/170 |
| 3,873,911 A | 3/1975 | Champlin | 324/430 |
| 3,876,931 A | 4/1975 | Godshalk | 324/429 |
| 3,886,443 A | 5/1975 | Miyakawa et al. | 324/426 |
| 3,889,248 A | 6/1975 | Ritter | 340/636 |
| 3,906,329 A | 9/1975 | Bader | 320/134 |
| 3,909,708 A | 9/1975 | Champlin | 324/431 |
| 3,936,744 A | 2/1976 | Perlmutter | 324/416 |
| 3,946,299 A | 3/1976 | Christianson et al. | 320/163 |
| 3,947,757 A | 3/1976 | Grube et al. | 324/416 |
| 3,969,667 A | 7/1976 | McWilliams | 324/427 |
| 3,979,664 A | 9/1976 | Harris | 324/397 |
| 3,984,762 A | 10/1976 | Dowgiallo, Jr. | 324/430 |
| 3,984,768 A | 10/1976 | Staples | 324/712 |
| 3,989,544 A | 11/1976 | Santo | 429/65 |
| 4,008,619 A | 2/1977 | Alcaide et al. | 73/724 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/434 |
| 4,070,624 A | 1/1978 | Taylor | 324/772 |
| 4,086,531 A | 4/1978 | Bernier | 324/772 |
| 4,112,351 A | 9/1978 | Back et al. | 324/380 |
| 4,114,083 A | 9/1978 | Benham et al. | 320/150 |
| 4,126,874 A | 11/1978 | Suzuki et al. | 324/429 |
| 4,178,546 A | 12/1979 | Hulls et al. | 324/772 |
| 4,193,025 A | 3/1980 | Frailing et al. | 324/427 |
| 4,207,611 A | 6/1980 | Gordon | 701/33 |
| 4,217,645 A | 8/1980 | Barry et al. | 320/136 |
| 4,297,639 A * | 10/1981 | Branham | 324/429 |
| 4,315,204 A | 2/1982 | Sievers et al. | 322/28 |
| 4,316,185 A | 2/1982 | Watrous et al. | 340/636 |
| 4,322,685 A | 3/1982 | Frailing et al. | 324/429 |
| 4,351,405 A | 9/1982 | Fields et al. | 180/65 |
| 4,363,407 A | 12/1982 | Barkler et al. | 209/3.3 |
| 4,369,407 A | 1/1983 | Korbell | 324/416 |
| 4,379,989 A | 4/1983 | Kurz et al. | 320/165 |
| 4,379,990 A | 4/1983 | Sievers et al. | 322/99 |
| 4,390,828 A | 6/1983 | Converse et al. | 320/153 |
| 4,392,101 A | 7/1983 | Saar et al. | 320/156 |
| 4,396,880 A | 8/1983 | Windebank | 320/156 |
| 4,408,157 A | 10/1983 | Beaubien | 324/712 |
| 4,412,169 A | 10/1983 | Dell'Orto | 320/123 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,459,548 A | 7/1984 | Lentz et la. | 324/384 |
| 4,514,694 A | 4/1985 | Finger | 324/429 |
| 4,520,353 A | 5/1985 | McAuliffe | 340/636 |
| 4,633,418 A | 12/1986 | Bishop | 320/136 |
| 4,659,977 A | 4/1987 | Kissel et al. | 320/150 |
| 4,663,580 A | 5/1987 | Wortman | 320/35 |
| 4,667,143 A | 5/1987 | Cooper et al. | 320/22 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/165 |
| 4,697,134 A | 9/1987 | Burkum et al. | 320/134 |
| 4,707,795 A | 11/1987 | Alber et al. | 324/433 |
| 4,709,202 A | 11/1987 | Koenck et al. | 320/112 |
| 4,710,861 A | 12/1987 | Kanner | 363/46 |
| 4,719,428 A | 1/1988 | Liebermann | 324/436 |
| 4,743,855 A | 5/1988 | Randin et al. | 324/430 |
| 4,745,349 A | 5/1988 | Palanisamy et al. | 320/125 |
| 4,816,768 A | 3/1989 | Champlin | 324/428 |
| 4,820,966 A | 4/1989 | Fridman | 320/116 |
| 4,825,170 A | 4/1989 | Champlin | 324/436 |
| 4,847,547 A | 7/1989 | Eng, Jr. | 320/35 |
| 4,849,700 A | 7/1989 | Morioka et al. | 324/427 |
| 4,876,495 A | 10/1989 | Palanisamy et al. | 320/106 |
| 4,881,038 A | 11/1989 | Champlin | 324/426 |
| 4,912,416 A | 3/1990 | Champlin | 324/430 |
| 4,913,116 A | 4/1990 | Katogi et al. | 123/406.32 |
| 4,929,931 A | 5/1990 | McCuen | 340/636 |
| 4,931,738 A | 6/1990 | MacIntyre et al. | 324/435 |
| 4,937,528 A | 6/1990 | Palanisamy | 324/430 |
| 4,947,124 A | 8/1990 | Hauser | 324/430 |
| 4,956,597 A | 9/1990 | Heavey et al. | 320/129 |
| 4,968,941 A | 11/1990 | Rogers | 324/428 |
| 4,968,942 A | 11/1990 | Palanisamy | 324/430 |
| 5,004,979 A | 4/1991 | Marino et al. | 324/160 |
| 5,032,825 A | 7/1991 | Xuznicki | 340/636 |
| 5,037,778 A | 8/1991 | Stark et al. | 437/216 |
| 5,047,722 A | 9/1991 | Wurst et al. | 324/430 |
| 5,087,881 A | 2/1992 | Peacock | 324/378 |
| 5,095,223 A | 3/1992 | Thomas | 307/110 |
| 5,126,675 A | 6/1992 | Yang | 324/435 |
| 5,140,269 A | 8/1992 | Champlin | 324/433 |
| 5,144,218 A | 9/1992 | Bosscha | 320/139 |
| 5,144,248 A | 9/1992 | Alexandres et al. | 324/428 |
| 5,160,881 A | 11/1992 | Schramm et al. | 322/7 |
| 5,170,124 A | 12/1992 | Blair et al. | 324/434 |
| 5,179,335 A | 1/1993 | Nor | 320/159 |
| 5,194,799 A | 3/1993 | Tomantschger | 320/2 |
| 5,204,611 A | 4/1993 | Nor et al. | 320/145 |
| 5,214,370 A | 5/1993 | Harm et al. | 320/152 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |
| 5,266,880 A | 11/1993 | Newland | 320/125 |
| 5,281,919 A | 1/1994 | Palanisamy | 324/427 |
| 5,281,920 A | 1/1994 | Wurst | 324/430 |
| 5,295,078 A | 3/1994 | Stich et al. | 320/136 |
| 5,298,797 A | 3/1994 | Redl | 327/387 |
| 5,300,874 A | 4/1994 | Shimamoto et al. | 320/106 |
| 5,302,902 A | 4/1994 | Groehl | 324/434 |
| 5,315,287 A | 5/1994 | Sol | 340/455 |
| 5,321,626 A | 6/1994 | Palladino | 324/432 |
| 5,331,268 A | 7/1994 | Patino et al. | 320/160 |
| 5,336,993 A | 8/1994 | Thomas et al. | 324/158.1 |
| 5,338,515 A | 8/1994 | Dalla Betta et al. | 422/95 |
| 5,339,018 A | 8/1994 | Brokaw | 320/147 |
| 5,343,380 A | 8/1994 | Champlin | 363/46 |
| 5,347,163 A | 9/1994 | Yoshimura | 307/66 |
| 5,352,968 A | 10/1994 | Reni et al. | 320/136 |
| 5,365,160 A | 11/1994 | Leppo et al. | 320/160 |
| 5,365,453 A | 11/1994 | Startup et al. | 320/136 |
| 5,381,096 A | 1/1995 | Hirzel | 324/427 |
| 5,412,323 A | 5/1995 | Kato et al. | 324/429 |
| 5,426,371 A | 6/1995 | Salley et al. | 324/429 |
| 5,426,416 A | 6/1995 | Jefferies et al. | 340/664 |
| 5,432,426 A | 7/1995 | Yoshida | 324/160 |
| 5,434,495 A | 7/1995 | Toko | 320/135 |
| 5,435,185 A | 7/1995 | Eagan | 73/587 |
| 5,442,274 A | 8/1995 | Tamai | 320/146 |
| 5,445,026 A | 8/1995 | Eagan | 73/591 |
| 5,449,996 A | 9/1995 | Matsumoto et al. | 320/148 |
| 5,449,997 A | 9/1995 | Gilmore et al. | 320/148 |
| 5,451,881 A | 9/1995 | Finger | 324/433 |
| 5,457,377 A | 10/1995 | Jonsson | 324/430 |
| 5,469,043 A | 11/1995 | Cherng et al. | 320/161 |
| 5,485,090 A | 1/1996 | Stephens | 324/433 |
| 5,488,300 A | 1/1996 | Jamieson | 324/432 |
| 5,519,383 A | 5/1996 | De La Rosa | 340/636 |
| 5,528,148 A | 6/1996 | Rogers | 320/137 |
| 5,537,967 A | 7/1996 | Tashiro et al. | 123/192.1 |

| | | | |
|---|---|---|---|
| 5,546,317 A | 8/1996 | Andrieu | 324/427 |
| 5,548,273 A | 8/1996 | Nicol et al. | 340/439 |
| 5,550,485 A | 8/1996 | Falk | 324/772 |
| 5,561,380 A | 10/1996 | Sway-Tin et al. | 324/509 |
| 5,562,501 A | 10/1996 | Kinoshita et al. | 439/852 |
| 5,572,136 A | 11/1996 | Champlin | 324/426 |
| 5,574,355 A * | 11/1996 | McShane et al. | 320/161 |
| 5,583,416 A | 12/1996 | Klang | 320/160 |
| 5,585,728 A | 12/1996 | Champlin | 324/427 |
| 5,589,757 A | 12/1996 | Klang | 320/160 |
| 5,592,093 A | 1/1997 | Klingbiel | 324/426 |
| 5,596,260 A | 1/1997 | Moravec et al. | 320/135 |
| 5,598,098 A | 1/1997 | Champlin | 324/430 |
| 5,602,462 A | 2/1997 | Stich et al. | 323/258 |
| 5,606,242 A | 2/1997 | Hull et al. | 320/106 |
| 5,621,298 A | 4/1997 | Harvey | 320/134 |
| 5,633,985 A | 5/1997 | Severson et al. | 704/267 |
| 5,637,978 A | 6/1997 | Kellett et al. | 320/2 |
| 5,642,031 A | 6/1997 | Brotto | 320/156 |
| 5,650,937 A | 7/1997 | Bounaga | 320/134 |
| 5,652,501 A | 7/1997 | McClure et al. | 320/134 |
| 5,653,659 A | 8/1997 | Kunibe et al. | 477/111 |
| 5,656,920 A | 8/1997 | Cherng et al. | 320/161 |
| 5,675,234 A | 10/1997 | Greene | 324/430 |
| 5,677,077 A | 10/1997 | Faulk | 429/90 |
| 5,699,050 A | 12/1997 | Kanazawa | 340/636 |
| 5,701,089 A | 12/1997 | Perkins | 327/772 |
| 5,705,929 A | 1/1998 | Caravello et al. | 324/430 |
| 5,710,503 A | 1/1998 | Sideris et al. | 320/116 |
| 5,711,648 A | 1/1998 | Hammerslag | 414/786 |
| 5,717,336 A | 2/1998 | Basell et al. | 324/430 |
| 5,717,937 A | 2/1998 | Fritz | 320/128 |
| 5,739,667 A | 4/1998 | Matsuda et al. | 320/128 |
| 5,747,909 A | 5/1998 | Syverson et al. | 310/156 |
| 5,754,417 A | 5/1998 | Nicollini | 363/60 |
| 5,757,192 A * | 5/1998 | McShane et al. | 324/427 |
| 5,760,587 A | 6/1998 | Harvey | 324/434 |
| 5,773,978 A | 6/1998 | Becker | 324/430 |
| 5,789,899 A | 8/1998 | van Phuoc et al. | 320/112 |
| 5,793,359 A | 8/1998 | Ushikubo | 345/169 |
| 5,808,469 A | 9/1998 | Kopera | 324/434 |
| 5,818,234 A | 10/1998 | McKinnon | 324/433 |
| 5,821,756 A | 10/1998 | McShane et al. | 324/430 |
| 5,825,174 A | 10/1998 | Parker | 324/106 |
| 5,831,435 A | 11/1998 | Troy | 324/426 |
| 5,862,515 A | 1/1999 | Kobayashi et al. | 702/63 |
| 5,872,443 A | 2/1999 | Williamson | 320/160 |
| 5,895,440 A | 4/1999 | Proctor et al. | 702/63 |
| 5,914,605 A | 6/1999 | Bertness | 324/430 |
| 5,927,938 A | 7/1999 | Hammerslag | 414/809 |
| 5,929,609 A | 7/1999 | Joy et al. | 322/25 |
| 5,939,855 A | 8/1999 | Proctor et al. | 320/104 |
| 5,939,861 A | 8/1999 | Joko et al. | 320/122 |
| 5,945,829 A | 8/1999 | Bertness | 324/430 |
| 5,951,229 A | 9/1999 | Hammerslag | 414/398 |
| 5,961,561 A | 10/1999 | Wakefield, II | 701/29 |
| 5,961,604 A | 10/1999 | Anderson et al. | 709/229 |
| 5,969,625 A | 10/1999 | Russo | 340/636 |
| 6,002,238 A | 12/1999 | Champlin | 320/134 |
| 6,008,652 A | 12/1999 | Theofanopoulos et al. | 324/434 |
| 6,009,369 A | 12/1999 | Boisvert et al. | 701/99 |
| 6,031,354 A | 2/2000 | Wiley et al. | 320/116 |
| 6,037,751 A | 3/2000 | Klang | 320/160 |
| 6,037,777 A | 3/2000 | Champlin | 324/430 |
| 6,051,976 A * | 4/2000 | Bertness | 324/426 |
| 6,072,299 A | 6/2000 | Kurie et al. | 320/112 |
| 6,072,300 A | 6/2000 | Tsuji | 320/116 |
| 6,081,098 A | 6/2000 | Bertness et al. | 320/134 |
| 6,091,245 A | 7/2000 | Bertness | 324/426 |
| 6,094,033 A | 7/2000 | Ding et al. | 320/132 |
| 6,104,167 A | 8/2000 | Bertness et al. | 320/132 |
| 6,114,834 A | 9/2000 | Parise | 320/109 |
| 6,137,269 A | 10/2000 | Champlin | 320/150 |
| 6,140,797 A | 10/2000 | Dunn | 320/105 |
| 6,144,185 A | 11/2000 | Dougherty et al. | 320/132 |
| 6,150,793 A | 11/2000 | Lesesky et al. | 320/104 |
| 6,161,640 A | 12/2000 | Yamaguchi | 180/65.5 |
| 6,163,156 A | 12/2000 | Bertness | 324/426 |
| 6,172,483 B1 | 1/2001 | Champlin | 320/134 |
| 6,172,505 B1 | 1/2001 | Bertness | 324/430 |
| 6,181,545 B1 | 1/2001 | Amatucci et al. | 361/502 |
| 6,222,369 B1 | 4/2001 | Champlin | 324/430 |
| 6,225,808 B1 | 5/2001 | Varghese et al. | 324/426 |
| 6,236,332 B1 | 5/2001 | Conkright et al. | 340/825.06 |
| 6,249,124 B1 | 6/2001 | Bertness | 324/426 |
| 6,250,973 B1 | 6/2001 | Lowery et al. | 439/763 |
| 6,254,438 B1 | 7/2001 | Gaunt | 439/755 |
| 6,259,254 B1 | 7/2001 | Klang | 324/427 |
| 6,262,563 B1 | 7/2001 | Champlin | 320/134 |
| 6,294,896 B1 | 9/2001 | Champlin | 320/134 |
| 6,294,897 B1 | 9/2001 | Champlin | 320/153 |
| 6,323,650 B1 | 11/2001 | Bertness et al. | 324/426 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B2 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,359,441 B1 | 3/2002 | Bertness | 324/426 |
| 6,363,303 B1 | 3/2002 | Bertness | 701/29 |

OTHER PUBLICATIONS

"Simple DC–DC Converts Allows Use of Single Battery", *Electronix Express,* downloaded from http://www.elexp-.com/t_dc–dc.htm, Nov. 10, 1998.

"DC–DC Converter Basics", *Power Designers,* downloaded from http://www.powederdesigners.com/InforWeb.design_center/articles/DC–DC–converter.shtm, 1998.

"Electrochemical Impedance Spectroscopy in Battery Development and Testing", *Batteries International,* Apr. 1997, pp. 59 and 62–63.

"Battery Impedance", by E. Willihnganz et al., *Electrical Engineering,* Sep. 1959, pp. 922–925.

"Determining The End of Battery Life", by S. DeBardelaben, *IEEE,* 1986, pp. 365–368.

"A Look at the Impedance of a Cell", by S. DeBardelaben, *IEEE,* 1988, pp. 394–397.

"The Impedance of Electrical Storage Cells", by N.A. Hampson et al., *Journal of Applied Electrochemistry,* 1980, pp. 3–11.

"A Package for Impedance/Admittance Data Analysis", by B. Boukamp, *Solid State Ionics,* 1986, pp. 136–140.

"Precision of Impedance Spectroscopy Estimates of Bulk, Reaction Rate, and Diffusion Parameters", by J. Macdonald et al., *J. Electroanal, Chem.,* 1991, pp. 1–11.

Internal Resistance: Harbinger of Capacity Loss in Starved Electrolyte Sealed Lead Acid Batteries, by Vaccaro, F.J. et al., *AT&T Bell Laboratories,* 1987 IEEE, Ch. 2477, pp. 128, 131.

IEEE Recommended Practice For Maintenance, Testings, and Replacement of Large Lead Storage Batteries for Generating Stations and Substations, *The Institute of Electrical and Electronics Engineeres, Inc.,* ANSI/IEEE Std. 450–1987, Mar. 9, 1987, pp. 7–15.

"Field and Laboratory Studies to Assess the State of Health of Valve–Regulated Lead Acid Batteries: Part I Conductance/Capacity Correlation Studies", by D. Feder et al., *IEEE,* Aug. 1992, pp. 218–233.

"Battery Impedance", by E. Willihnganz et al., *Electrical Engineering,* Sep. 1959, pp. 922–925.

"JIS Japenese Industrial Standard–Lead Acid Batteries for Automobiles", *Japanese Standards Association UDC,* 621.355.2:629.113.006, Nov. 1995.

"Performance of Dry Cells", by C. Hambuechen, Preprint of *Am. Electrochem. Soc.,* Apr. 18–20, 1912, paper No. 19, pp. 1–5.

"A Bridge for Measuring Storage Battery Resistance", by E. Willihncanz, *The Electrochemical Society,* preprint 79–20, Apr. 1941, pp. 253–258.

National Semiconductor Corporation, "High Q Notch Filter", 3/69, Linear Brief 5, Mar. 1969.

Burr–Brown Corporation, "Design A 60 Hz Notch Filter with the UAF42", Jan. 1994, AB–071, 1994.

National Semiconductor Corporation, "LMF90–$4^{th}$–Order Elliptic Notch Filter", Dec. 1994, RRD–B30M115, Dec. 1994.

* cited by examiner

INTEGRATED CONDUCTANCE AND LOAD TEST BASED ELECTRONIC BATTERY TESTER

The present application is based on and claims the benefit of U.S. provisional patent application Ser. No. 60/208,264, filed May 31, 2000, and also is a continuation-in-part of U.S. patent application Ser. No. 09/293,020, filed Apr. 16, 1999, pending; and is also a continuation-in-part of U.S. patent application Ser. No. 09/703,270, filed Oct. 31, 2000, pending which claims the benefit of U.S. provisional patent application Ser. No. 60/163,013, filed Nov. 1, 1999, the content of which is hereby incorporated by reference in its entirety.

BACKGROUND OF THE INVENTION

The present invention relates to storage batteries. More specifically, the present invention relates to electronic battery testers used to test storage batteries.

Storage batteries, such as lead acid storage batteries, are used in a variety of applications such as automotive vehicles and standby power sources. Typical storage batteries consist of a plurality of individual storage cells which are electrically connected in series. Each cell can have a voltage potential of about 2.1 volts, for example. By connecting the cells in the series, the voltages of the individual cells are added in a cumulative manner. For example, in a typical automotive storage battery, six storage cells are used to provide a total voltage of about 12.6 volts. The individual cells are held in a housing and the entire assembly is commonly referred to as the "battery."

It is frequently desirable to ascertain the condition of a storage battery. Various testing techniques have been developed over the long history of storage batteries. For example, one technique involves the use of a hygrometer in which the specific gravity of the acid mixture in the battery is measured. Electrical testing has also been used to provide less invasive battery testing techniques. A very simple electrical test is to simply measure the voltage across the battery. If the voltage is below a certain threshold, the battery is determined to be bad. Another technique for testing a battery is referred to as a load test. In a load test, the battery is discharged using a known load. As the battery is discharged, the voltage across the battery is monitored and used to determine the condition of the battery. More recently, techniques have been pioneered by Dr. Keith S. Champlin and Midtronics, Inc. of Willowbrook, Ill. for testing storage battery by measuring a dynamic parameter of the battery such as the dynamic conductance of the battery. These techniques are described in a number of United States patents, for example, U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELL AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Ser. No. 09/293,020, filed Apr. 16, 1999, entitled AUTOMOTIVE BATTERY CHARGING SYSTEM TESTER; U.S. Ser. No. 09/544,696, filed Apr. 7, 2000, entitled ELECTRONIC BATTERY TESTER; U.S. Ser. No. 09/304,315,filed May 3, 1999, entitled MIDPOINT BATTERY MONITOR"; U.S. Ser. No. 09/290,133, filed Mar. 26, 1999, entitled ELECTRONIC BATTERY TESTER; U.S. Ser. No. 09/560,920, filed Apr. 28, 2000, entitled MULTI-LEVEL CONDUCTANCE TESTER; U.S. Ser. No. 09/431,446, filed Nov. 1, 1999, entitled ALTERNATOR DIAGNOSTIC SYSTEM; U.S. Ser. No. 09/432,473, filed Nov. 1, 1999, entitled ELECTRONIC BATTERY TESTER WITH INTERNAL BATTERY; U.S. Ser. No. 09/388,501, filed Sep. 1, 1999, entitled METHOD AND APPARATUS FOR EVALUATING STORED CHARGE IN AN ELECTROCHEMICAL CELL OR BATTERY; U.S. Ser. No. 069/703,270, filed Oct. 31, 2000, entitled ELECTRONIC BATTERY TESTER; U.S. Ser. No. 09/503,015, filed Feb. 11, 2000, entitled METHOD AND APPARATUS FOR MEASURING COMPLEX ADMITTANCE OF CELLS AND BATTERIES; U.S. Ser. No. 09/564,740, filed May 4, 2000, entitled ENERGY MANAGEMENT SYSTEM FOR AUTOMOTIVE VEHICLE; U.S. Ser. No. 09/575,629, filed May 22, 2000, entitled VEHICLE ELECTRICAL SYSTEM TESTER WITH ENCODED OUTPUT; U.S. Ser. No. 09/780,146, filed Feb. 9, 2001, entitled STORAGE BATTERY WITH INTEGRAL BATTERY TESTER; U.S. Ser. No. 09/575,627, filed May 22, 2000, entitled METHOD AND APPARATUS FOR CHARGING A BATTERY; U.S. Ser. No. 09/577,421, filed May 22, 2000, entitled METHOD AND APPARATUS FOR CHARGING A BATTERY; U.S. Ser. No. 09/816,768, filed March 23, 2001, entitled MODULAR BATTERY TESTER; U.S. Ser. No. 09/662,401, filed Sep. 14, 2000, entitled TESTING PARALLEL STRINGS OF STORAGE BATTERIES; U.S. Ser. No. 09/662,092, filed Sep. 14, 2000, entitled ELECTRONIC BATTERY TESTER FOR TESTING PARALLEL STRINGS OF STORAGE BATTERIES; U.S. Ser. No. 09/654,715, filed Sep. 5, 2000, entitled APPARATUS FOR CALIBRATING ELECTRONIC BATTERY TESTER; U.S. Ser. No. 09/691,586, filed Oct. 18, 2000, entitled METHOD AND APPARATUS FOR ELECTRONICALLY EVALUATING THE INTERNAL TEMPERATURE OF AN ELECTROCHEMICAL CELL OR BATTERY; U.S. Ser. No. 09/710,031, filed Nov. 10, 2000, entitled METHOD AND APPARATUS FOR MEASURING COMPLEX SELF-IMMITTANCE OF A GENERAL ELECTRICAL ELEMENT; U.S. Ser. No. 09/740,254, filed Dec. 18, 2000, entitled ELECTRICAL CONNECTION FOR ELECTRONIC BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/483,623, filed Jan. 13, 2000, entitled ALTERNATOR TESTER; and U.S. Ser. No. 09/361,487, filed Jul. 26, 1999, entitled APPARATUS AND METHOD FOR CARRYING OUT DIAGNOSTIC TESTS ON BATTERIES FOR RAPIDLY CHARGING BATTERIES.

SUMMARY OF THE INVENTION

An electronic battery tester for testing a storage battery includes first and second Kelvin connections configured to couple to the battery. A forcing function applies a time varying signal to the battery through the first and second Kelvin connections. Further, a resistive load is configured to couple across the first and second terminals of the battery and draw a relatively large current. The storage battery is tested as a function of a dynamic parameter measured through the first and second Kelvin connections and as a function of a response of the storage battery to the relatively large current drawn through the resistive load.

DETAILED DESCRIPTION OF THE PREFERRED EMBODIMENTS

The present invention includes an electronic battery tester which measures a dynamic parameter of a battery. The dynamic parameter is measured in response to a small forcing function applied across the battery. The forcing function includes a time varying component and can be any type of periodic or transient signal with such a component. Typically, the forcing function will have a relatively small amplitude and can be any type of voltage or current signal either drawn from or applied to the battery. The battery tester includes a resistive load capable of drawing a large current from the battery. A battery test is performed on the battery which provides a test result as a function both of the dynamic parameter and a response of the battery of the applied load resistance. The particular response observed or application of the load can vary for various embodiments. In one aspect the dynamic parameter is measured using Kelvin connections across the battery. In some embodiments the resistive load is connected across the battery using the same Kelvin connections. The combination of a test which uses a dynamic parameter as well as a load resistance can provide improved accuracy in determining the condition of the storage battery. The internal resistive load can also apply to alternator and starter testing for testing the charging system and starter motor of an automotive vehicle.

Figure 1:
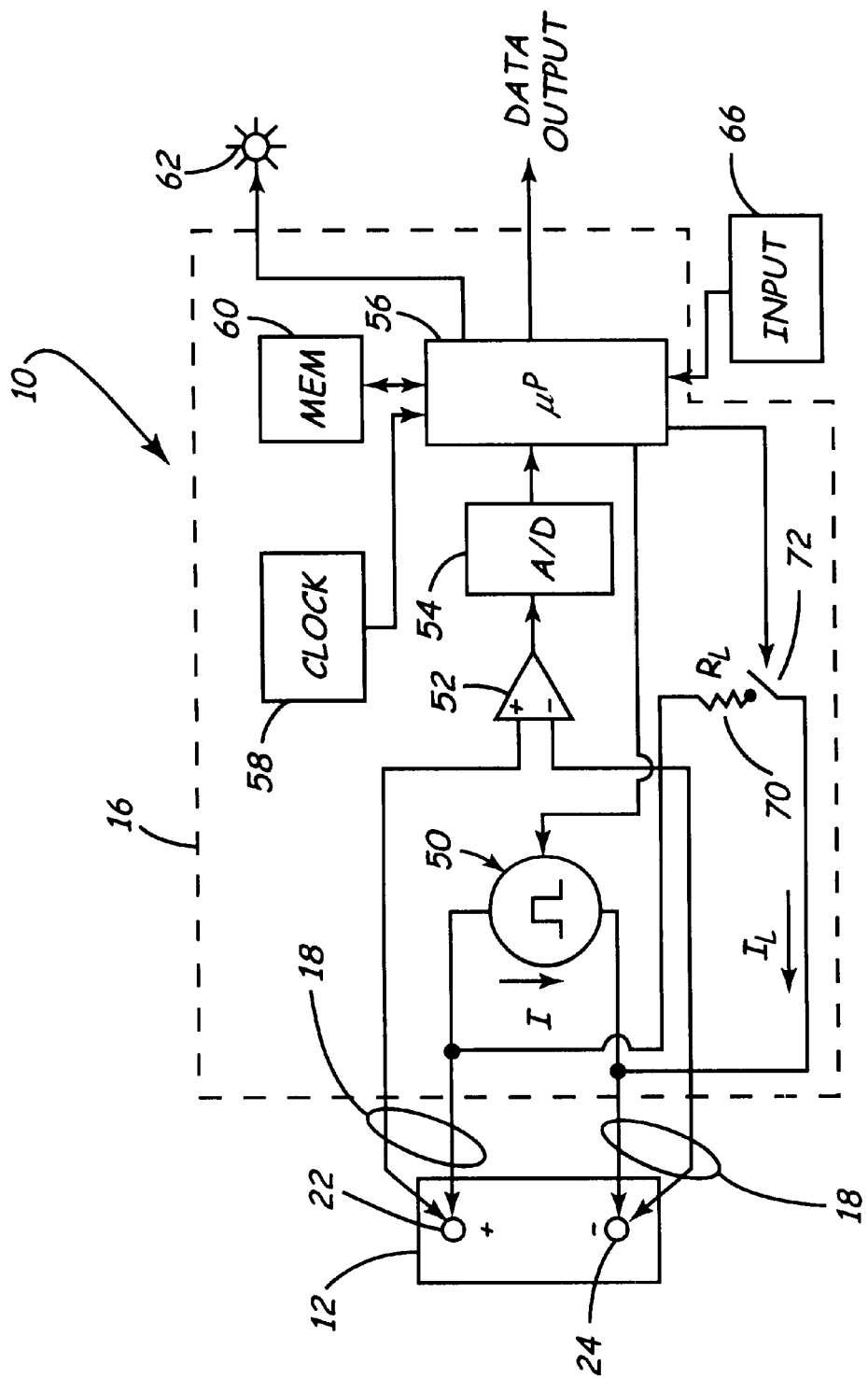
FIG. 1 is a simplified block diagram showing an electronic battery tester in accordance with one embodiment of the present invention.

FIG. 1 is a simplified block diagram of electronic battery tester 10 in accordance with one aspect of the invention. Tester 10 includes electronic battery test circuit 16 which couples to battery 12 through Kelvin connections 18. Circuitry 16 determines the battery conductance of a battery 12. Circuitry 16 includes forcing function 50, differential amplifier 52, analog-to-digital converter 54 and microprocessor 56. Amplifier 52 is capacitively coupled to battery 12 through capacitance C1 and C2, and has an output connected to an input of analog-to-digital converter 54. Microprocessor 56 is connected to system clock 58, memory 60, and warning indicator 62, an input 66 and provides a data output, such as for a display.

In operation, forcing function 50 is controlled by microprocessor 56 and provides a current in the direction shown by the arrow in the figure. In one embodiment, this is square wave or a pulse. Typically, source 50 is a small load applied to battery 12. Differential amplifier 52 is connected to terminals 22 and 24 of battery 12 and provides an output related to the voltage difference between these terminals. Amplifier 52 has a high input impedance. Note that circuitry 16 is connected to battery 12 through a four-point connection technique known as a Kelvin connection. Because very little current flows through amplifier 52 which has a large input impedance, the voltage drop through its connections to battery 12 is insignificant. The output of differential amplifier 52 is converted to digital format and provided to microprocessor 56. Microprocessor 56 operates at a frequency determined by system clock 58 according to program instructions stored in memory 60.

Microprocessor 56 determines the dynamic conductance of battery 12 by applying a current pulse with forcing function 50. Forcing function 50 comprises a small load or an active source. The microprocessor determines the change in battery voltage due to the current pulse using amplifier 52 and analog-to-digital converter 54. The amount of current I generated by forcing function 50 is known or can be measured and stored in memory 60. Microprocessor 56 calculates the conductance of battery 12 as follows:

$$\text{Conductance} = G = \frac{\Delta I}{\Delta V} \qquad \text{Eq. 1}$$

where $\Delta I$ is the change in current flowing through battery 12 due to forcing function 50, and $\Delta V$ is the change in battery voltage due to applied current $\Delta I$. The relative conductance of battery 12, can be calculated using the equation:

$$\text{Relative Conductance}(\%) = \frac{G_{measured}}{G_{reference}} \times 100 \qquad \text{Eq. 2}$$

where $G_{measured}$ is the measured battery conductance in accordance with Equation 1 and $G_{reference}$ is a reference conductance value stored in memory 60 which can be received through input 66. Generally, this reference conductance is determined based upon the type and characteristics of battery 12. Microprocessor 56 can also operate using impedance, admittance, or resistance measurements.

FIG. 1 also shows a load resistor 70 labeled $R_L$ coupled across terminals 22 and 24 of battery 12 and in series with switch 72. Switch 72 is coupled to and controlled by microprocessor 56 to selectively switch resistive load $R_L$ in series with battery 12. Microprocessor 56 operates to perform the various tests as discussed above to determine the condition of the battery 12.

Figure 2:
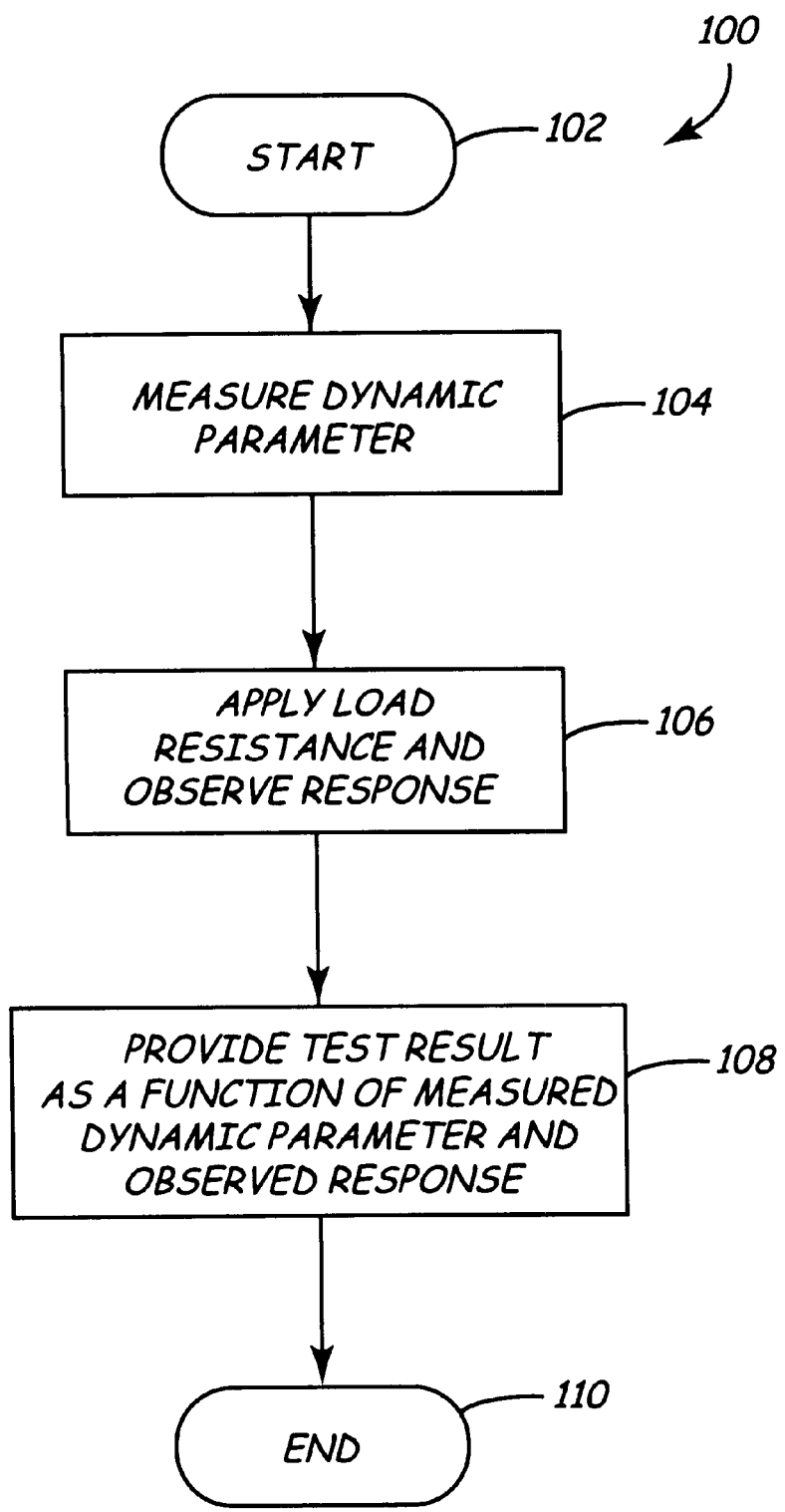
FIG. 2 is a simplified block diagram showing steps in accordance with one aspect of the invention.

FIG. 2 is a simplified block diagram 100 which illustrates steps performed by microprocessor 56 based upon instructions stored in memory 60 in one example embodiment. The test procedure starts at block 102 and control is passed to block 104. A dynamic parameter of battery 12 is measured, using any appropriate technique, such as the technique discussed above. At block 106, load resistance 70 $R_L$ is applied by microprocessor 56 through the actuation of switch 72. Microprocessor 56 observes a response of battery 12. For example, in the embodiment shown in FIG. 1, microprocessor 56 can observe the voltage or voltage change across battery 12 in response to the applied resistance $R_L$ using analog to digital converter 54. At block 108, microprocessor 56 provides a test result output, for example on the data output, of the dynamic parameter measured at step 104 and the load resistance and response observed at step 106. The particular order of the steps or tests performed can be changed accordingly. The procedure terminates at block 110.

The particular test performed using the addition of the load resistance can be any battery test which provides a result which is a function of a dynamic parameter measurement and the applied load. In one example, the battery test result is a function of the measured dynamic parameter with the resistive load $R_L$ on. This can be combined with a dynamic parameter measurement with the resistive load off. Other example load measurements which can be combined with the dynamic parameter measurement include monitoring the battery voltage over an adjustable time period while the load is applied. This can be combined with monitoring the voltage during a recovering period after the load is removed. In one embodiment load $R_L$ is a variable load which can be controlled, for example, by microprocessor 56 during the testing process. The response of the battery to the application of the variable load and changing of the variable load can be monitored as well as its response once the load is removed. In a specific example, the relative conductance determined in accordance with Equation 2 can be used as a multiplier against the nominal voltage of the battery, for example 12.7 volts, and again multiplied by a constant. This value can then be compared to the voltage of the battery measured at a particular time during application of the load resistance or after its removal. The various measurements can also be correlated with the state of health and/or the battery life expectancy which can then be provided as an output.

The voltage when the load is applied can also be compared to a voltage range which can indicate that the battery 12 has a bad cell. This can then be provided as an output or a warning can be indicated using output 62. In a more specific example, a bad cell can be detected if a voltage measured with the load applied at a first time and a voltage measured at a second time are within a range, such as 8.0 volts to 8.8 volts (two bad cells) or 10.1 volts to 10.9 volts (one bad cell), microprocessor 56 can determine that a bad cell exists in battery 12 and provide an appropriate output. Additionally, microprocessor 56 can determine if a battery has an open circuit by using the measured dynamic parameter in conjunction with the change in voltage across battery 12 with and without the resistive load $R_L$ applied. The resistance $R_L$ can also be used to remove a surface charge (a positive voltage polarization) on battery 12. Once the surface charge is removed, microprocessor 56 can compensate the dynamic parameter measurement in determining battery condition based upon the measured voltage after removal of surface charge.

The correlation between the dynamic parameter and measurements taken which are a function of the load resistance $R_L$ to the condition of battery 12 can be determined by repeated laboratory tests to develop trends or equations which describe the relationship. Any appropriate technique can be used including models which model the battery, the use of multiple measurements to develop a model, neural networks, etc. Although the load resistance $R_L$ is shown in FIG. 1 as being coupled to the battery 12 through the Kelvin connections 18, any appropriate electrical coupling technique can be used. This includes the use of fifth or sixth additional electrical contacts to terminals 22 and 24. Additionally, in one embodiment all four of the electrical contacts shown in Kelvin connections 18 are used to couple the resistive load $R_L$ to battery 12. The duration of the application of the resistive load $R_L$ or frequency of the application, can be chosen as appropriate for a desired testing format.

In one aspect, circuitry 10 provides an alternator tester for testing an alternator of a vehicle. In such an embodiment, the load resistance $R_L$ is used to apply an additional load to the electrical system of the vehicle. The response of the alternator and regulator of the automotive vehicle can be observed and the microprocessor 56 can provide an output indicative of the condition of the alternator and/or regulator. If the load resistance $R_L$ is a variable resistor, the voltage across the battery 12, or some other point in the electrical system, can be observed as various resistive loads are placed on the system.

The dynamic parameter used in the present invention can be obtained in accordance with any appropriate technique. Various examples and aspects of battery testing are shown in the following references which are incorporated herein by reference in their entirety: U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137, 269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELL AND BATTERIES; U.S. Pat. No. 6,172, 505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Ser. No. 09/293,020, filed Apr. 16, 1999, entitled AUTOMOTIVE BATTERY CHARGING SYSTEM TESTER; U.S. Ser. No. 09/544,696, filed Apr. 7, 2000, entitled ELECTRONIC BATTERY TESTER; U.S. Ser. No. 09/304,315, filed May 3, 1999, entitled MIDPOINT BATTERY MONITOR"; U.S. Ser. No. 09/290,133, filed Mar. 26, 1999, entitled ELECTRONIC BATTERY TESTER; U.S. Ser. No. 09/560,920, filed Apr. 28, 2000, entitled MULTI-LEVEL CONDUCTANCE TESTER; U.S. Ser. No. 09/431,446, filed Nov. 1, 1999, entitled ALTERNATOR DIAGNOSTIC SYSTEM; U.S. Ser. No. 09/432,473, filed Nov. 1, 1999, entitled ELECTRONIC BATTERY TESTER WITH INTERNAL BATTERY; U.S. Ser. No. 09/388,501, filed Sep. 1, 1999, entitled METHOD AND APPARATUS FOR EVALUATING STORED CHARGE IN AN ELECTROCHEMICAL CELL OR BATTERY; U.S. Ser. No. 069/703,270, filed Oct. 31, 2000, entitled ELECTRONIC BATTERY TESTER; U.S. Ser. No. 09/503,015, filed Feb. 11, 2000, entitled METHOD AND APPARATUS FOR MEASURING COMPLEX ADMITTANCE OF CELLS AND BATTERIES; U.S. Ser. No. 09/564,740, filed May 4, 2000, entitled ENERGY MANAGEMENT SYSTEM FOR AUTOMOTIVE VEHICLE; U.S. Ser. No. 09/575,629, filed May 22, 2000, entitled VEHICLE ELECTRICAL SYSTEM TESTER WITH ENCODED OUTPUT; U.S. Ser. No. 09/780,146, filed Feb. 9, 2001, entitled STORAGE BATTERY WITH INTEGRAL BATTERY TESTER; U.S. Ser. No. 09/575, 627, filed May 22, 2000, entitled METHOD AND APPARATUS FOR CHARGING A BATTERY; U.S. Ser. No. 09/577,421, filed May 22, 2000, entitled METHOD AND APPARATUS FOR CHARGING A BATTERY; U.S. Ser. No. 09/816,768, filed Mar. 23, 2001, entitled MODULAR BATTERY TESTER; U.S. Ser. No. 09/662,401, filed Sep. 14, 2000, entitled TESTING PARALLEL STRINGS OF STORAGE BATTERIES; U.S. Ser. No. 09/662,092, filed Sep. 14, 2000, entitled ELECTRONIC BATTERY TESTER FOR TESTING PARALLEL STRINGS OF STORAGE BATTERIES; U.S. Ser. No. 09/654,715, filed Sep. 5, 2000, entitled APPARATUS FOR CALIBRATING ELECTRONIC BATTERY TESTER; U.S. Ser. No. 09/691,586, filed Oct. 18, 2000, entitled METHOD AND APPARATUS FOR ELECTRONICALLY EVALUATING THE INTERNAL TEMPERATURE OF AN ELECTROCHEMICAL CELL OR BATTERY; U.S. Ser. No. 09/710,031, filed Nov. 10, 2000, entitled METHOD AND APPARATUS FOR MEASURING COMPLEX SELF-IMMITTANCE OF A GENERAL ELECTRICAL ELEMENT; U.S. Ser. No. 09/740,254, filed Dec. 18, 2000, entitled ELECTRICAL CONNECTION FOR ELECTRONIC BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ ADMITTANCE; U.S. Ser. No. 09/862,783, filed May 21, 2001, entitled METHOD AND APPARATUS FOR TEST- ING CELLS AND BATTERIES EMBEDDED IN SERIES/ PARALLEL SYSTEMS; U.S. Ser. No. 09/483,623, filed Jan. 13, 2000, entitled ALTERNATOR TESTER; and U.S. Ser. No. 09/361,487, filed Jul. 26, 1999, entitled APPARATUS AND METHOD FOR CARRYING OUT DIAGNOSTIC TESTS ON BATTERIES FOR RAPIDLY CHARGING BATTERIES.

In various aspects, the dynamic parameter is measured prior to, during or subsequent to application of the load resistance across terminals of the battery. Further, the measured dynamic parameter can be compared with dynamic parameters measured at other periods in time, for example, dynamic parameters obtained prior to, during or subsequent to application of the load resistance can be compared with each other. Voltage measurements can be obtained and a slope of the voltage measurement can be calculated and used in the battery test. In one example, the battery test is a function of a slope of the voltage measured while the load resistance is applied to the battery. The change in voltage slope can be used in the battery test. The voltage slope can be measured subsequent to disconnection of the load resistance from the battery. The battery test can be based upon a change in the voltage measured subsequent to disconnection of the load resistance from the battery. The battery test can be a function of a difference in voltage measured while the load resistance is applied to the battery and a voltage measured after disconnection of the load. In one aspect, the output from the battery test can provide an indication that the battery has become sulfated. The voltage slope measured before, during or after removal of the load resistance can be used in the battery test. The voltage slope, particularly the voltage slope after disconnection of the load from the battery, can be used as an indication of an open circuit. In one embodiment, the load resistance 70 shown in FIG. 1 is located external to the battery tester. For example, the load resistance is placed directly in the cable assembly used for Kelvin connections 18.

Although the present invention has been described with reference to preferred embodiments, workers skilled in the art will recognize that changes may be made in form and detail without departing from the spirit and scope of the invention.

What is claimed is:

1. An electronic battery tester for testing a storage battery comprising:
   a first Kelvin connection configured to electrically couple to a first terminal of the battery;
   a second Kelvin connection configured to electrically couple to a second terminal of the battery;
   a forcing function configured to apply a time varying signal to the battery through the first and second Kelvin connections;
   a load resistance $R_L$ configured to couple across the first and second terminals of the battery and draw a relatively large current therethrough; and
   a microprocessor configured to test the storage battery as a function of a dynamic parameter measured through the first and second Kelvin connections in response to applied time varying signal and as a function of a response of the storage battery to the relatively large current drawn through the load resistance.

2. The electronic battery tester of claim 1 wherein the dynamic parameter is measured by the microprocessor when the load resistance is coupled across the terminals of the battery.

3. The electronic battery tester of claim 1 wherein the dynamic parameter is measured by the microprocessor prior to coupling the load resistance across the terminals of the battery.

4. The electronic battery tester of claim 1 wherein the dynamic parameter is measured when the load resistance is disconnected from the first and second terminals of the battery.

5. The electronic battery tester of claim 1 wherein the dynamic parameter measured when the load resistance is coupled across the terminals of the battery is compared to the dynamic parameter measured prior to the load resistance being coupled across the battery.

6. The electronic battery tester of claim 1 wherein the dynamic parameter measured when the load resistance is coupled across the terminals of the battery is compared to the dynamic parameter measured after the load resistance is disconnected from the battery.

7. The electronic battery tester of claim 1 wherein the dynamic parameter measured prior to the load resistance is coupled across the terminals of the battery is compared to the dynamic parameter measured after the load resistance is disconnected from the battery.

8. The electronic battery tester of claim 1 wherein the battery test is a function of voltage measured while the load resistance is applied to the battery.

9. The electronic battery tester of claim 1 wherein the battery test is a function of a slope of the voltage measured while the load resistance is applied to the battery.

10. The electronic battery tester of claim 9 wherein the battery test is a function of a change in voltage slope measured while the load resistance is applied to the battery.

11. The electronic battery tester of claim 1 wherein the battery test is a function of the difference in a voltage measured while the load resistance is applied to the battery and a voltage prior to application of the load.

12. The electronic battery tester of claim 1 wherein the battery test is a function of a voltage measured subsequent to disconnection of the load resistance from the battery.

13. The electronic battery tester of claim 1 wherein the battery test is a function of a slope of the voltage measured subsequent to disconnection of the load resistance from the battery.

14. The electronic battery tester of claim 1 wherein the battery test is a function of a change in voltage slope measured subsequent to disconnection of the load resistance from the battery.

15. The electronic battery tester of claim 1 wherein the battery test is a function of a difference in voltage measured while the load resistance is applied to the battery and a voltage after disconnection of the load.

16. The electronic battery tester of claim 1 wherein a duration of application of the load resistance is variable.

17. The electronic battery tester of claim 1 wherein the duration of voltage measurements subsequent to removal of the load resistance is variable.

18. The electronic battery tester of claim 1 wherein the resistance of the load resistance is variable.

19. The electronic battery tester of claim 18 wherein the variable load is controlled by the microprocessor.

20. The electronic battery tester of claim 1 wherein a pass/fail voltage threshold measured while the load resistance is applied is determined by the microprocessor as a function of the measured dynamic parameter.

21. The electronic battery tester of claim 1 wherein the microprocessor provides a state of health output as a function of the test.

22. The electronic battery tester of claim 1 wherein the microprocessor provides an output indicative of a sulfated battery as a function of the test.

23. The electronic battery tester of claim 1 wherein the microprocessor provides a battery life expectancy output as a function of the test.

24. The electronic battery tester of claim 1 wherein the microprocessor provides an output indicative of a shorted cell within the storage battery.

25. The electronic battery tester of claim 24 wherein an indication of the shorted cell is a function of a voltage measured while the load resistance is coupled across the battery.

26. The electronic battery tester of claim 24 wherein an indication of the shorted cell is a function of a voltage slope measured while the load resistance is coupled across the battery.

27. The electronic battery tester of claim 24 wherein an indication of the shorted cell is a function of a voltage slope measured after the load resistance is disconnected from the battery.

28. The electronic battery tester of claim 24 wherein an indication of the shorted cell is a function of a voltage difference after the load resistance is disconnected from the battery compared with a voltage prior to application of the load resistance.

29. The electronic battery tester of claim 1 wherein the load resistance is coupled to the battery through the first and second Kelvin connections.

30. The electronic battery tester of claim 1 wherein the microprocessor provides an output indicative of an open circuit in the battery.

31. The electronic battery tester of claim 30 wherein the indication of an open circuit is a function of an open circuit voltage measurement across the battery and a load voltage measurement across the battery obtained while the load resistance is applied to the battery.

32. The electronic battery tester of claim 30 wherein the indication of an open circuit is a function of the slope of a voltage measurement across the battery after the load is disconnected from the battery.

33. The electronic battery tester of claim 1 wherein the microprocessor applies the load resistance to the battery prior to measuring the dynamic parameter to thereby reduce a surface charge voltage associated with the battery.

34. The electronic battery tester of claim 33 wherein the test is a function of battery voltage subsequent to the reduction of surface charge.

35. The electronic battery tester of claim 1 wherein the resistance load is connected externally to the tester.

36. The electronic battery tester of claim 35 wherein the resistive load is located within a Kelvin cable assembly.

* * * * *